United States Patent [19]

Kataoka et al.

[11] 4,204,132
[45] May 20, 1980

[54] HIGHLY SENSITIVE HALL ELEMENT

[75] Inventors: Shoei Kataoka, Tanashi; Yoshinobu Sugiyama, Musashi-Murayama; Hiroyuki Fujisada, Kawasaki, all of Japan

[73] Assignee: Agency of Industrial Science & Technology, Ministry of International Trade & Industry, Tokyo, Japan

[21] Appl. No.: 822,658

[22] Filed: Aug. 8, 1977

[30] Foreign Application Priority Data

Aug. 11, 1976 [JP] Japan ............................ 51-94788
Aug. 11, 1976 [JP] Japan ............................ 51-94789

[51] Int. Cl.² .............................................. H03B 7/00
[52] U.S. Cl. .............................. 307/309; 331/107 G
[58] Field of Search .................... 307/309; 331/107 G; 323/4; 330/6

[56] References Cited

U.S. PATENT DOCUMENTS

| 3,195,043 | 7/1965 | Burig et al. | 307/309 |
| 3,634,780 | 11/1972 | Bosch | 307/309 |
| 3,714,473 | 1/1973 | Bartelink et al. | 307/309 |
| 3,731,123 | 5/1973 | Matsushita | 307/309 |
| 3,825,777 | 7/1974 | Braun | 307/309 |

Primary Examiner—Stanley D. Miller, Jr.
Assistant Examiner—B. P. Davis
Attorney, Agent, or Firm—Oblon, Fisher, Spivak, McClelland & Maier

[57] ABSTRACT

A semiconductor capable of exhibiting an electron transfer effect in a high electric field is used as a Hall element. Application of a voltage large enough to give rise to an electron transfer effect to the current input electrodes of the Hall element brings about a decrease in the concentration of electrons contributing to the Hall effect occurring within the semiconductor, an increase in the Hall coefficient and a notable enhancement in the sensitivity of the Hall element.

8 Claims, 10 Drawing Figures

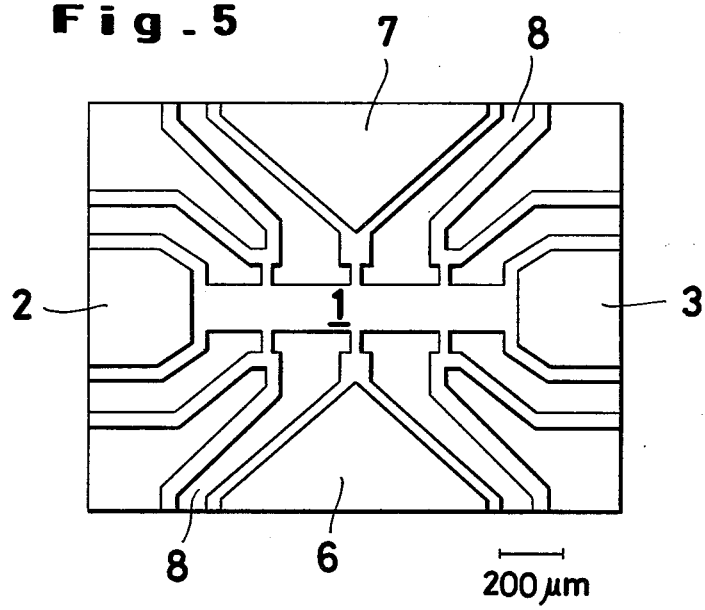
Fig. 5
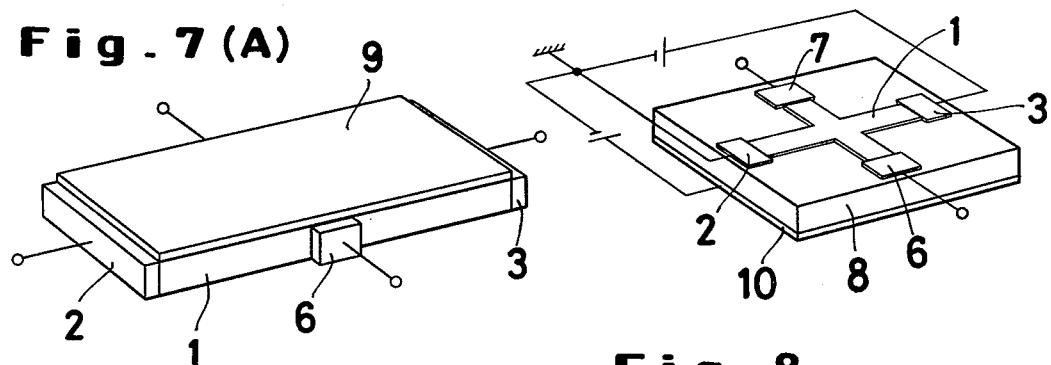
Fig. 7(A)
Fig. 7(B)
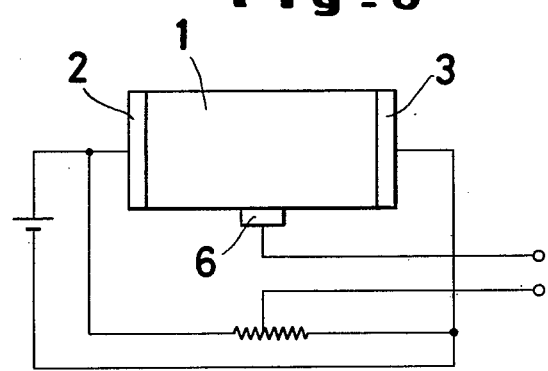
Fig. 8

1

HIGHLY SENSITIVE HALL ELEMENT

BACKGROUND OF THE INVENTION

This invention relates to a highly sensitive Hall element.

The Hall element finds utility as an element for the measurement of magnetic fields and for the conversion of the intensity of a magnetic field into an electrical signal. The Hall element enjoys numerous notable advantages such as, for example, ability to permit measurement of electric fields without requiring direct contact, high reliability of performance and high speed of response. It has to date found utility in applications to ammeters, wattmeters, magnetic reproducing heads, multipliers, displacement transducers, tachometers, etc.

One of the present inventors has already proposed a method and apparatus for detecting magnetic bubbles by use of two or more Hall elements (U.S. Pat. No. 3,973,182).

As semiconductors which are usable as Hall elements in such applications, those made of InSb and InAs are known in the art. Recently, semiconductors of GaAs have come to find popular acceptance because of their ability to improve the temperature stability. When an electric current "I" is supplied and a magnetic field "B" is vertically applied to a Hall element made of a semiconductor having a Hall coefficient "$R_H$" and a thickness "d", the Hall voltage "$V_H$" to be obtained from the element is expressed by equation (1) given below.

$$V_H = \frac{R_H}{d} \cdot B \cdot I \qquad (1)$$

The sensitivity "K" of this Hall element is expressed by equation (2) and the Hall coefficient "$R_H$" by equation (3) respectively.

$$K = \frac{R_H}{d} \qquad (2)$$

$$R_H = \frac{1}{n \cdot e} \qquad (3)$$

where "e" is the electric charge of the electron and "n" is the electron concentration.

Enhancement of the sensitivity of the Hall element, therefore, has to date been attempted such as by selecting a semiconductor material having a high Hall coefficient, namely a semiconductor material of high purity, and by minimizing the thickness of the Hall element. Owing to the technical standards prevalent today, however, these measures invariably have their own limits.

SUMMARY OF THE INVENTION

An object of the present invention is to provide Hall elements having extremely high sensitivity.

To accomplish the object described above according to the present invention, there is provided a Hall element which comprises a semiconductor exhibiting an electron transfer effect in a high electric field, incorporating input current electrodes one each at opposite ends and at least one Hall output electrode disposed on one side of the semiconductor and means for applying to said input current electrodes a voltage enough for the semiconductor to exhibit an electron transfer effect.

When a semiconductor capable of exhibiting an electron transfer effect is used as a Hall element and a voltage enough for the semiconductor to exhibit an electron transfer effect is applied thereto, the Hall element functions so as to bring about a decrease in the concentration of electrons contributing to the Hall effect occurring within the semiconductor, a consequent increase in the Hall coefficient and a notable enhancement in the sensitivity of the Hall element.

The other objects and characteristic features of the present invention will become apparent from the detailed description to be given hereinafter with reference to the accompanying drawings.

BRIEF DESCRIPTION OF THE DRAWINGS

FIG. 5 is a plan view of another embodiment of the Hall element according to the present invention.

FIGS. 7(A) and 7(B) are perspective views of a Hall element of this invention which is capable of suppressing generation of a traveling high electric field domain.

FIG. 8 is an explanatory diagram of still another embodiment of the Hall element of this invention.

DESCRIPTION OF THE PREFERRED EMBODIMENTS

As already described enhancement of the sensitivity of the Hall element has heretofore been attempted such as by selecting a semiconductor material of high purity or by decreasing the thickness of the Hall element, for example. Hall elements obtained in consequence of such measures have exhibited sensitivity of the order of 1 V/A·KG at most. One of the present inventors involved in U.S. Pat. No. 3,973,182 manufactured Hall elements with materials of high purity and subjected them to a test for sensitivity under favorable conditions. In the experiment, he could obtain a Hall element having sensitivity of about 30 V/A·KG. It was extremely difficult technically to attain any further improvement in the sensitivity of the Hall element such as by increasing the purity of the semiconductor material or by decreasing the thickness of the semiconductor.

The inventors took notice of the fact that the Hall coefficient "$R_H$" is in inverse proportion to the electron concentration "n" as is evident from equation (3). They continued studies and experiments in this respect and have, consequently, made a discovery that the electron transfer effect of a specific semiconductor, when utilized for producing a decrease in the concentration of available electrons contributing to the Hall effect within the Hall element, serves the purpose of increasing the Hall coefficient and, owing to the increased Hall coefficient, readily enabling the sensitivity of the Hall element to be notably enhanced despite the fact that the decrease in the thickness of the semiconductor has its limit. The present invention has issued from this discovery.

Figure 1A:
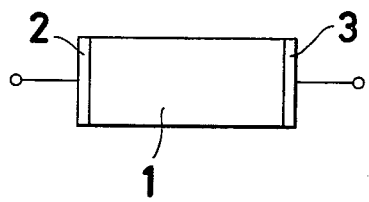
FIGS. 1(A) and 1(B) are explanatory diagrams of the principle underlying the enhancement of sensitivity in the Hall element of the present invention.
Figure 1B:
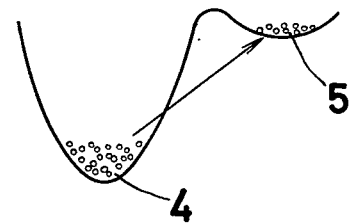

Now, the principle of the present invention will be described with reference to FIG. 1. When a high electric field is applied to a semiconductor 1 having a Hall effect and exhibiting an electron transfer effect, the electrons present in the lower energy valley 4 of the electron conduction band contributing to electric conductivity gradually gain in average speed. When the electric field increases and exceeds a certain critical value, there ensues an electron transfer effect. Gradually, the electrons in the lower energy valley 4 are transferred to the upper energy valley 5. As compared with the lower energy valley 4, the upper energy valley 5 has a decisively low electron mobility. Thus, when the electrons are transferred to the upper energy valley 5 as described above, the mobility of the electrons in the upper energy valley is very much lowered. In the case of a semiconductor of GaAs, for example, the electron mobility drops to about 1/50th when the electrons are transferred to the upper energy valley from the lower energy valley. Therefore, it is the electrons in the lower energy valley 4 that mainly contribute to the Hall effect of the semiconductor. Since the electrons are transferred to the upper energy valley 5 by virtue of the electron transfer effect as pointed out above, the electron concentration available is consequently lowered. As the result, the Hall coefficient is increased and the sensitivity of the Hall element is enhanced as is evident from equation (3).

Figure 2:
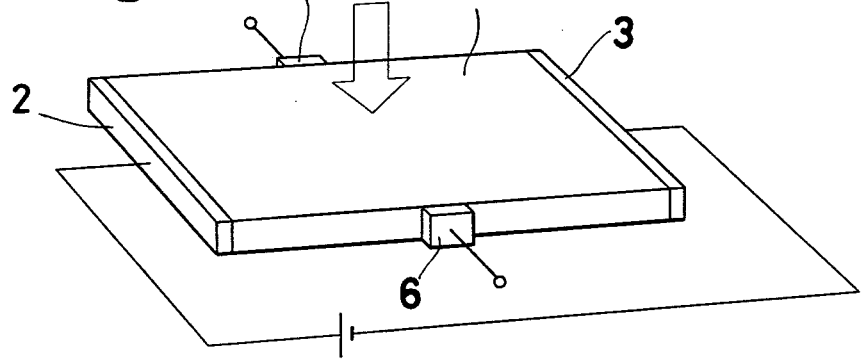
FIG. 2 is a perspective view of a basic construction of the highly sensitive Hall element of the present invention.

FIG. 2 shows a basic construction of the Hall element according to the present invention. The semiconductor 1 such as GaAs, InP or $In_{1-x}Ga_xSb$ which possesses an electron transfer effect is provided at the opposite ends thereof with input current electrodes 2, 3 and at the opposite lateral sides thereof with Hall output electrodes 6, 7. When a D.C. high voltage is applied via the input electrodes and a magnetic field "B" is present in a direction perpendicular to the direction of the flow of electric current, there occurs a Hall voltage between the Hall output electrodes 6, 7. By the existing theory, the Hall voltage thus generated is to be determined, as is obvious from equation (1), by the magnetic field "B" and the electric current "I". In the present invention, since there is applied to the Hall element such a voltage large enough to produce an electron transfer effect, the electrons present in the lower energy valley within the element gradually gain in average speed and, as the applied voltage exceeds a certain critical value, there ensues the electron transfer effect, with the result that the electrons in the lower energy valley begin to transfer to the upper energy valley and the electron concentration in the lower energy valley contributing to the Hall effect decreases. As is clear from equation (3), the Hall coefficient "$R_H$" increases and the Hall voltage induced between the Hall electrodes 6, 7 is remarkably increased as compared with that involved in the conventional Hall element.

Figure 3:
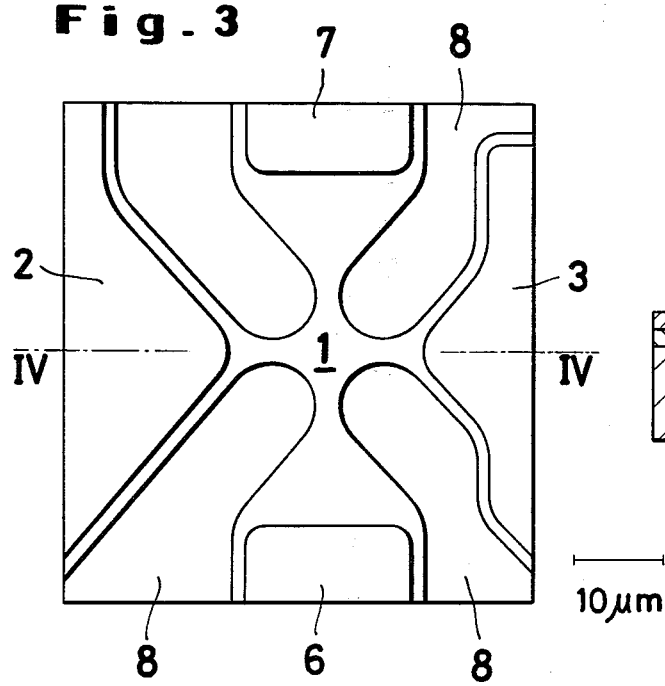
FIG. 3 is a plan view of one embodiment of the Hall element according to the present invention.
Figure 4:
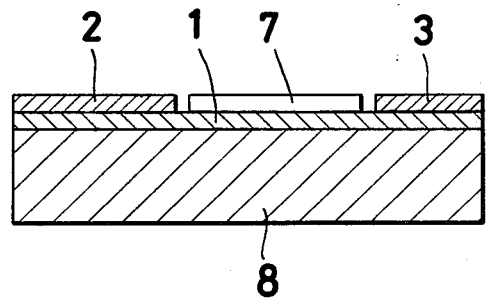
FIG. 4 is a sectional view taken along the line IV—IV of FIG. 3.

FIGS. 3 and 4 illustrate one embodiment of the Hall element of the present invention.

On an insulating substrate 8 (made of an insulating GaAs in this case), an n-type GaAs layer having a thickness of 1.4 $\mu$m and an electron concentration of $1.8 \times 10^{15}$ cm$^{-3}$ was epitaxially grown. In this layer, input current electrodes 2, 3 were fabricated at an interval of about 26 $\mu$m and Hall output electrodes 6, 7 were also fabricated at an interval of about 44 $\mu$m by metal evaporation. On the GaAs layer 1, a Hall element of crossshape with four arms about 4 $\mu$m wide and about 6 $\mu$m long was formed by the ion beam etching technique.

Figure 6:
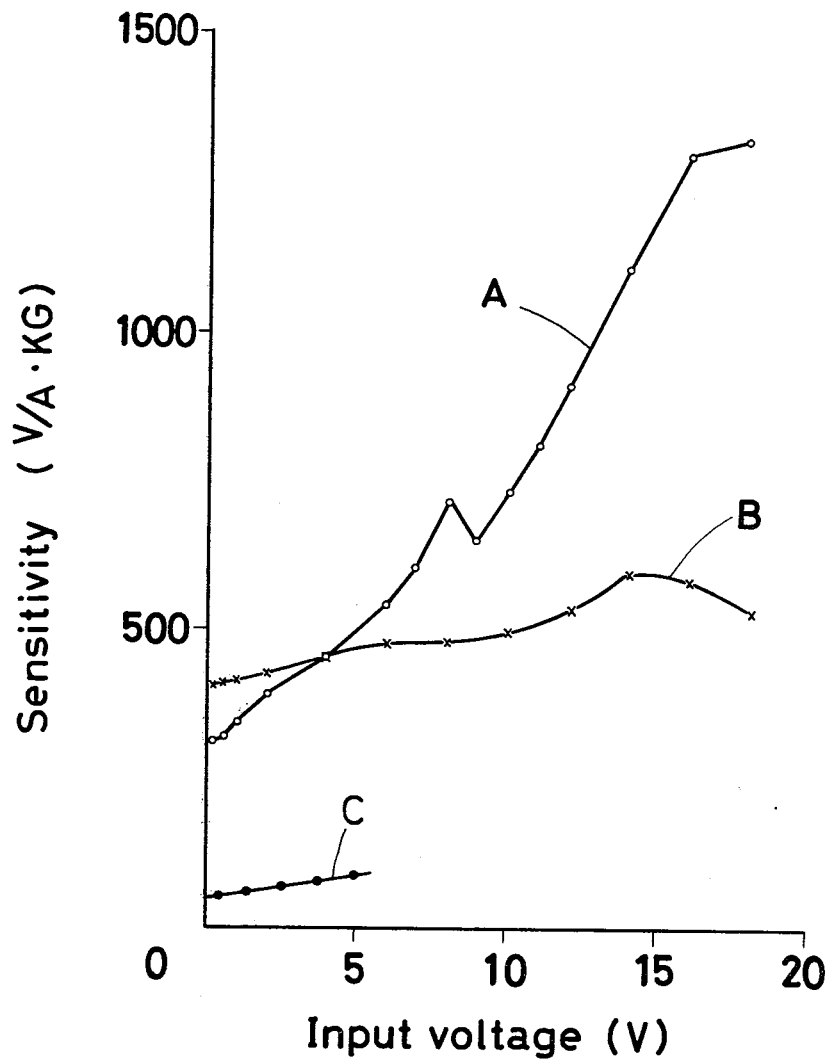
FIG. 6 is a graph showing the relationship between the voltage applied and the sensitivity obtained of the Hall elements of FIGS. 4 and 5.

The sensitivity of the Hall element produced as described above was determined by measuring the Hall voltage which was induced by transversely applying a fixed magnetic flux of 1 KG uniformly onto the Hall element and also applying a varying voltage to the input current electrodes 2, 3. The results were as shown by the curve "A" in the graph of FIG. 6. It is clear from the graph that at the fixed value of magnetic field of 1 KG, the sensitivity was about 310 V/A·KG when the applied voltage was 0.2 V, whereas the sensitivity was increased to 1320 V/A·KG when the applied voltage rose to 18 V, indicating that the increase in the applied voltage enhanced the sensitivity to about four times.

An eight-terminal Hall element was made by using a GaAs layer of the dimensions indicated in FIG. 5. The sensitivity of this Hall element was similarly determined by measuring the Hall voltage which was induced at the centrally situated Hall output electrodes 6, 7 by applying a fixed magnetic flux of 1 KG and also applying a varying voltage to the input current electrodes 2, 3. The results were as shown by the curve "B" in the graph of FIG. 6.

It is found from the curve "B" of the graph that the sensitivity of the Hall element was enhanced as the applied voltage was increased. The enhancement of the sensitivity is apparently ascribable to the electron transfer effect. Since the smaller the distance between input electrodes, the higher the electric field in the semiconductor and, consequently, the larger the enhancement in the sensitivity. A method which accomplishes such an enhancement in the sensitivity of a Hall element by use of such an effect has never been known to the art.

For use as a Hall element in the present invention, there can be used a semiconductor of any type insofar as the semiconductor possesses a Hall effect and exhibits an electron transfer effect in a high electric field. Examples of semiconductors which are usable for the purpose of this invention include those of GaAs, InP and $In_{1-x}Ga_xSb$. Where temperature stability and other similar properties are taken into account, semiconductors of GaAs prove to be advantageous from the practical point of view.

The high D.C. voltage which is applied to the input current electrodes must be capable of bringing about an electron transfer effect in the semiconductor; so that the electric field strength is high enough to cause the electrons present in the lower energy valley to be transferred into the upper energy valley. It is well known that when the magnitude of an electric field exceeds a certain critical value, a high electric field domain is created near the anode of the semiconductor and is caused to travel toward the cathode. This phenomenon is used to realize a microwave oscillator, namely the Gunn diode.

In the case of the present invention, since the electron transfer effect is utilized, the sensitivity of the Hall element can be sufficiently enhanced by applying to the Hall element an electric field of a value even below the critical level at which the creation of a high electric field domain occurs. Nevertheless, as the traveling high electric field domain is a phenomenon ascribed to the negative differential mobility due to the electron transfer effect, a Hall element under such a condition still shows an enhancement in the sensitivity. When the Hall element is used at D.C. or low frequency, oscillation of an extremely high frequency (microwave) therefore, does not pose any serious problem.

However, greater enhancement of the sensitivity, stability and suppression of noise can be obtained by providing the Hall element with means to suppress the traveling of a high electric field domain and to make the electric field distribution as uniform as possible within the semiconductor. One effective measure for suppressing the traveling of a high electric field domain consists in keeping the thickness of the Hall element below the limit beyond which the element suffers from creation of a high electric field domain. Another effective measure resides in keeping the distance between the input current electrodes below the limit beyond which there is created a traveling high electric field domain. Specifically in the case of a Hall element using the GaAs, the creation of a traveling high electric field domain can be precluded by satisfying the conditions, $n \cdot d < 10^{11}$ cm$^{-2}$ and $n \cdot l < 10^{12}$ cm$^{-2}$ (wherein, "n" stands for electron concentration, "d" for thickness and "l" for distance between the input current electrodes).

Expanding the cross section of the semiconductor at the anode side is also effective to suppress traveling high electric field domains.

Besides, effective control of the creation of a traveling high electric field domain can be obtained by providing an insulating layer or dielectric layer 9 on the surface of the Hall element as illustrated in FIG. 7(A) or by using an insulating or dielectric material as the substrate 8 as illustrated in FIG. 3.

Further, suppression of an unstable high electric field domain can efficiently be achieved by putting a metal layer 10 on the opposite surface of an insulator 8 provided on the Hall element as illustrated in FIG. 7(B). In this case GaAs of a higher electron concentration of $1.5 \times 10^{16}$ cm$^{-3}$ is used. The distance between the input current electrodes and width of the semiconductor are 25 μm and 4 μm, respectively, being very similar to the dimensions referred to in connection with FIG. 3. A metal layer was formed at the back surface of the insulating GaAs as a substrate by a vacuum deposition technique. An enhancement in the sensitivity was also observed as shown by the curve "C" in the graph of FIG. 6. As the electron concentration of this material is high enough to create a traveling high electric field domain it would have shown instability without the metal backing. However, with the metal backing on the insulating substrate, the element showed very stable performance. This metal layer is also effective to keep the electric field distribution in the semiconductor uniformly high.

In the preceding embodiments, the Hall elements have been described as possessing at least four terminals. The present invention can also be applied to three-terminal Hall elements using only one Hall output electrode. In this case, the material of the semiconductor, the input voltage and other factors are entirely the same as those of four-terminal Hall elements. One embodiment of the circuitry to be used is shown in FIG. 8.

As described in full detail above, the present invention is directed to a Hall element using a semiconductor capable of exhibiting an electron transfer effect and is aimed at enhancing the sensitivity of said Hall element by applying between the input current electrodes thereof a voltage enough for the semiconductor to manifest an electron transfer effect for thereby lowering the concentration of available electrons and increasing the Hall coefficient. This invention can easily be applied effectively to various devices using conventional Hall elements and, therefore, proves to be enormously advantageous.

What is claimed is:

1. A highly sensitive Hall element comprising a semiconductor possessing a Hall effect and exhibiting an electron transfer effect in a high electric field, input current electrodes provided at the opposite ends of said semiconductor, at least one Hall output electrode provided at one side of said semiconductor, and means for applying to said input current electrodes a voltage large enough to lower the electron concentration available for the Hall effect in said semiconductor, the lowered electron concentration resulting in an increase in the Hall coefficient to thereby considerably enhance the sensitivity of the Hall element.

2. The Hall element according to claim 1, wherein said semiconductor exhibiting an electron transfer effect in a high electric field is of GaAs type.

3. The Hall element according to claim 1, further comprising an insulator layer having said semiconductor disposed therein.

4. A highly sensitive Hall element comprising a semiconductor possessing a Hall effect and exhibiting an electron transfer effect in a high electric field, said semiconductor being disposed within an insulator layer and said insulator layer being backed by a metal layer; input current electrodes provided at the opposite ends of said semiconductor; at least one Hall output electrode provided at one side of said semiconductor; and means for applying to said input current electrodes a voltage large enough for said semiconductor to cause an electron transfer effect.

5. The Hall element according to claim 1, which further comprises a dielectric layer provided on the surface of said semiconductor.

6. A highly sensitive Hall element comprising a semiconductor possessing a Hall effect and exhibiting an electron transfer effect in a high electric field, said semiconductor having a thickness that is kept below the limit beyond which there occurs creation of a traveling high electric field domain; input current electrodes provided at the opposite ends of said semiconductor; at least one Hall output electrode provided at one side of said semiconductor; and means for applying to said input current electrodes a voltage large enough for said semiconductor to cause an electron transfer effect.

7. A highly sensitive Hall element comprising a semiconductor possessing a Hall effect and exhibiting an electron transfer effect in a high electric field; input current electrodes provided at the opposite ends of said semiconductor, and the distance between said two input current electrodes being kept below the limit beyond which there occurs creation of a traveling high electric field domain; at least one Hall output electrode provided at one side of said semiconductor; and means for applying to said input current electrodes a voltage large enough for said semiconductor to cause an electron transfer effect.

8. A highly sensitive Hall element comprising a semiconductor possessing a Hall effect, suppressing traveling high electric field domains by enlarging the cross section of said semiconductor at the anode side, and exhibiting an electron transfer effect in a high electric field; input current electrodes provided at the opposite ends of said semiconductor; at least one Hall output electrode provided at one side of said semiconductor; and means for applying to said input current electrodes a voltage large enough for said semiconductor to cause an electron transfer effect.

* * * * *